(12) United States Patent
Desineni et al.

(10) Patent No.: US 7,971,176 B2
(45) Date of Patent: Jun. 28, 2011

(54) METHOD FOR TESTING INTEGRATED CIRCUITS

(75) Inventors: Rao H. Desineni, Poughkeepsie, NY (US); Maroun Kassab, St.-Eustache (CA); Franco Motika, Hopewell Junction, NY (US); Leah Marie Pfeifer Pastel, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 601 days.

(21) Appl. No.: 12/050,207

(22) Filed: Mar. 18, 2008

(65) Prior Publication Data

US 2009/0240458 A1 Sep. 24, 2009

(51) Int. Cl.
*G06F 17/50* (2006.01)
*G06F 11/22* (2006.01)
*G06F 19/00* (2006.01)

(52) U.S. Cl. .................................. 716/136; 702/120
(58) Field of Classification Search .............. 716/4, 136; 702/120; 714/32, 726, 732, 742
See application file for complete search history.

(56) References Cited

U.S. PATENT DOCUMENTS

| | | | | |
|---|---|---|---|---|
| 6,658,616 | B1 * | 12/2003 | Chang et al. | 714/728 |
| 6,662,327 | B1 * | 12/2003 | Rajski | 714/738 |
| 6,836,856 | B2 | 12/2004 | Blanton | |
| 7,370,254 | B2 * | 5/2008 | Rajski et al. | 714/726 |
| 7,437,640 | B2 * | 10/2008 | Rajski et al. | 714/729 |
| 7,509,550 | B2 * | 3/2009 | Rajski et al. | 714/732 |
| 2003/0233600 | A1 * | 12/2003 | Hartman et al. | 714/32 |
| 2004/0205681 | A1 * | 10/2004 | Nozuyama | 716/4 |
| 2006/0005094 | A1 * | 1/2006 | Nozuyama | 714/738 |
| 2007/0234169 | A1 * | 10/2007 | Rajski et al. | 714/742 |
| 2009/0210764 | A1 * | 8/2009 | Nozuyama | 714/737 |

OTHER PUBLICATIONS

Cho et al.; "Gate Exhaustive Testing"; in Proceedings of the International Test Conference, Nov. 2005; pp. 182-187.
Ma et al.; "An Experimental Test Chip to Evaluate Test Techniques Experimental Results"; in Proceedings of the International Test Conference, Oct. 1995; pp. 663-672.
Nelson et al.; "Multiple-Detect ATPG Based on Physical Neighborhoods"; in SRC TECHCON, Oct. 2005.
Zachariah et al.; "On Modeling Cross-Talk Faults"; Proc. of Design, Automation and Test in Europe Conference, Mar. 2003; pp. 490-495.
Sengupta et al.; "Defect-Based Test: A Key Enabler for Successful Migration to Structural Test"; Intel Technology Journal Q1'99; http://developer.intel.com/technology/itj/q11999/articles/art_6.htm.

* cited by examiner

*Primary Examiner* — Jack Chiang
*Assistant Examiner* — Magid Y Dimyan
(74) *Attorney, Agent, or Firm* — Schmeiser, Olsen & Watts; Michael J. LeStrange (57) ABSTRACT

A method of testing an integrated circuit. The method includes selecting a set of physical features of nets and devices of the integrated circuit, the integrated circuit having pattern input points and pattern observation points connected by the nets, each of the nets defined by an input point and all fan out paths to (i) input points of other nets of the nets or (ii) to the pattern observation points; selecting a measurement unit for each feature of the set of features; assigning a weight to each segment of each fan out path based on a number of the measurement units of the feature in each segment of each fan out path of each of the nets; and generating a set of test patterns optimized for test-coverage and cost based on the weights assigned to each segment of each of the nets of the integrated circuit.

10 Claims, 9 Drawing Sheets

METHOD FOR TESTING INTEGRATED CIRCUITS

FIELD OF THE INVENTION

The present invention generally relates to the field of testing integrated circuits; more specifically, it relates to methods of evaluating the effectiveness of existing tests with regards to a selected set of physical design features and attributes associated with the selected features, and generating new tests that maximize the detection of the said set of physical design features or attributes.

BACKGROUND OF THE INVENTION

Testing of integrated circuits is an important part of the integrated circuit manufacturing process. Testing is used not only for preventing defective or unreliable chips from being shipped to customers, but also allows analysis of the fails so as to make adjustments to the design or fabrication steps of the chip. Conventional testing methodologies are based on models at the logic-level (gate-level) of the circuit design, which may not incorporate information about the physical implementation of the design. Tests generated from models may not completely test the circuit, and thus many physical defects may not be found or the failures they cause may be difficult to analyze and diagnose. Therefore, there exists a need for a method of generating test patterns and evaluating the test patterns based on how well the test patterns test the physical features and attributes associated with the features of an integrated circuit.

Further, prior art in this domain has focused on defect modeling techniques and testing for physical defects based on the aforementioned defect models. Defect models are not comprehensive and are often times based on one or a set of defect assumptions. Accordingly, there exists a need in the art to evaluate existing test patterns and generate test patterns to test for selected physical layout features.

SUMMARY OF THE INVENTION

A first aspect of the present invention is a method of testing integrated circuits, comprising: determining paths of an integrated circuit, the path comprising one or more nets; selecting a set of physical features or attributes of the features of the nets of the integrated circuit, the integrated circuit having one or more pattern input points and one or more pattern observation points connected by the nets, each of the nets defined by an input point and all fan out paths to (i) input points of other nets of the nets or (ii) to the pattern observation points, each net of the nets comprising one or more connected segments; selecting a measurement unit for each feature of the set of features or attributes of the features; assigning a weight to each segment of the nets based on a number of the measurement units of the feature in each segment of each fan out path of each of the nets; and generating a set of test patterns based on the weights assigned to each segment of each fan out path of each of the nets of the integrated circuit.

A second aspect of the present invention is a method of testing integrated circuits, comprising: generating a test netlist, the test netlist describing nets of an integrated circuit and faults for testing the nets; generating a physical netlist, the physical netlist describing physical features of the nets; selecting a set of physical features of nets of the integrated circuit from the physical netlist, the integrated circuit having one or more pattern input points and one or more pattern observation points connected by the nets, each of the nets defined by an input point and all fan out paths to (i) input points of other nets of the nets or (ii) to the pattern observation points, each net of the nets comprising one or more connected segments; selecting a measurement unit for each feature of the set of features or attributes of the features; assigning a weight to each the segment of each fan out path of each of the nets based on a number of the measurement units of the feature in each segment of each fan out path of each of the nets; generating a weighted test netlist by mapping the weights of each the segment from the physical netlist to corresponding faults in the test netlist, the faults being independent of any particular fault model; generating a set of test patterns based on the weighted test netlist.

A third aspect of the present invention is a method of evaluating the effectiveness of existing test patterns, comprising: defining and selecting a set of physical features or attributes of the features as targets for testing, the physical features or attributes of the features being the attributes of the nets of the integrated circuit; selecting a measurement unit for each feature or attribute of the feature of the set of features or attributes of the features; assigning a weight to each of the nets based on a number of the measurement units of the feature in each segment of the nets; selecting a set of faults based on a fault model in the test netlist; generating a weighted test netlist by mapping the weights of each segment from the physical netlist to corresponding faults in the test netlist; and fault simulating the existing test patterns to determine its feature-based test coverage.

BRIEF DESCRIPTION OF THE DRAWINGS

The features of the invention are set forth in the appended claims. The invention itself, however, will be best understood by reference to the following detailed description of illustrative embodiments, when read in conjunction with the accompanying drawings, wherein:

DETAILED DESCRIPTION OF THE INVENTION

Figure 1A:
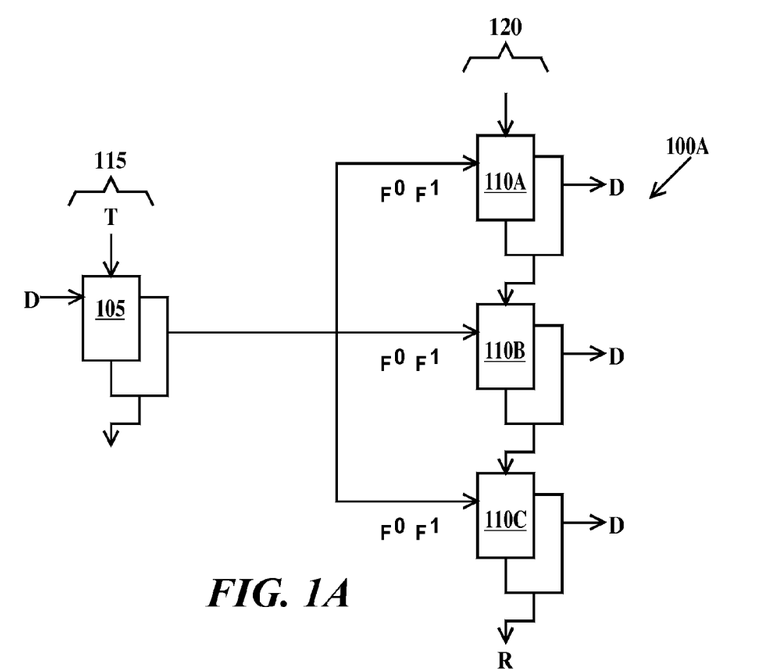
FIG. 1A is a circuit diagram of an exemplarily net to be tested.

FIG. 1A is a circuit diagram of an exemplarily net to be tested. In FIG. 1A, a logical net representation 100A includes a pattern input point 105 and pattern observation points 110A, 110B and 110C. Pattern input points 105 are places that test patterns can be presented to the circuit paths, connecting pattern input point 105 and pattern output points 110A, 110B and 110C. Pattern observation points 110A, 110B and 110C are places where resultant patterns can be observed from outside the integrated circuit chip. $F^0$ and $F^1$ are exemplary stuck-at faults, which represent stuck-at zero and stuck-at one behavior, respectively. Other faults representing behaviors and conditions that the present invention may test for, include but are not limited to, bridging (e.g. shorts) faults, net cross-coupling faults, transition (e.g. AC delays) faults, pattern (e.g. multiple inputs to a gate) faults and open faults. A fault represents a potential fail of a certain type. Faults are included in the test netlist and test models where they represent potential fails of specific nets, pins, and circuits. Test patterns generated using faults exercise conditions needed to expose fails. This invention is compatible with any fault definition (the faults not having to be specific to a specific fault model or type of fault model); though it is advantageous if the fault behavior is suited to the physical features and attributes of physical features of the integrated circuit being tested. Physical features include but are not limited to area, length, width of the nets and devices of the integrated circuit being tested and attributes of the physical features include but are not limited to resistance, capacitance, signal delay, statistical variation over a features population, the location of the feature in a lithographic mask used to define the feature during fabrication of the integrated circuit being tested.

Test coverage is a metric that indicates how well fails will be detected with a set of test patterns. For example, one definition of conventional test coverage calculation is the relative comparison of how many faults are detected during test generation divided by the total number of faults included in the test netlist. In this invention, test coverage may be calculated relatively or absolutely based on the prevalence and/or weighting factors of physical features or feature attributes in the test netlist or in the physical integrated circuit, respectively. In one example, feature-based test coverage of the present invention is the ratio of amount of selected features tested to the total amount of selected features in the integrated circuit being tested.

A test pattern is a pattern of logical ones and zeros. A resultant pattern is a pattern of logical ones and zeros resulting from running the test pattern through combinational logic in the paths between pattern input point 105 and pattern observation points 110A, 110B and 110C and is observed at the pattern observation points. By comparing a resultant test response pattern to an expected pattern (or to the test pattern itself if the integrated circuit has the proper circuitry) it can be determined if a fail exists in the circuit or not. Expected patterns are generated along with the test pattern themselves. For the purposes of describing the present invention, it should be understood that when test patterns are generated or selected, corresponding expected patterns may also be generated or selected. Pattern input point 105 may also include analog signal or energy stimulus points (such as suitable for laser, heat or light stimuli). Pattern observation points 110A, 110B, and 110C are points in the design where the resultant patterns may be observed (such as chip I/Os, scan chain I/Os, and scan chain latches). They may also include points accessible by analog or energy output or observation points (such as voltage or current or magnetic field measurements or photon or thermal or light energy capture or waveform acquisition). Test pattern results are measured at pattern observation points 110A, 110B, and 110C. Pattern input point 105 and pattern observation points 110A, 110B, 110C may be internal or external to the chip being tested.

Combinational logic comprises one or more logical gates (e.g. AND, OR, NAND. NOR, BUFFER, INVERTER, etc). A net element may be a resistor, capacitor, inductor, diode, single logic gate, a combination of logic gates connected by wires and vias connecting wires. In one example, pattern input point 105 and pattern observation points 110A, 110B and 110C) are latches. A combinational logic comprises a set of circuit elements such as gates, macros, library cells, etc, connected to each other with nets such that no feedback loop is created. Further, a combinational logic circuit does not contain any sequential elements such as latches and flip-flops.

In the example of FIG. 1A, pattern input point 105 is a latch in a scan-in chain 115 and pattern observation points 110A, 110B and 110C are latches in a scan-out chain 120. This is advantageous since it simplifies the determination of pattern input points and pattern observation points, resulting in the simplification of the entire testing process. Scan-in and scan-out chains can be components of level sensitive scan design (LSSD) logic, which allows simplified testing of combinational logic. While testing, the latches in LSSD scan-chains allow loading test patterns (T) into scan-in ports of latches of the scan-in chains (as in a shift register) from an input pin of the integrated circuit and then allow clocking of those patterns through the combinational logic from the data-out ports of the latches of the scan-in chain to the data-in ports of latches of the scan-out chains where resultant patterns (R) can then be propagated to an output pad of the integrated circuit. In operational mode, the latches pass data signals (D) into and out of the combinational logic from other circuits in the integrated circuit. The LSSD design is one example where the presented invention can be applied; the invention can be applied in its entirety to any scan-based design.

The terms scan-in and scan-out scan chains are relative. A latch in a scan-in chain that is the pattern input point to one signal path may be a pattern observation point of another signal path. Further, scan-in chains and scan-out chains may only be portions of another larger scan chain or a subset of multiple scan chains.

Figure 1B:
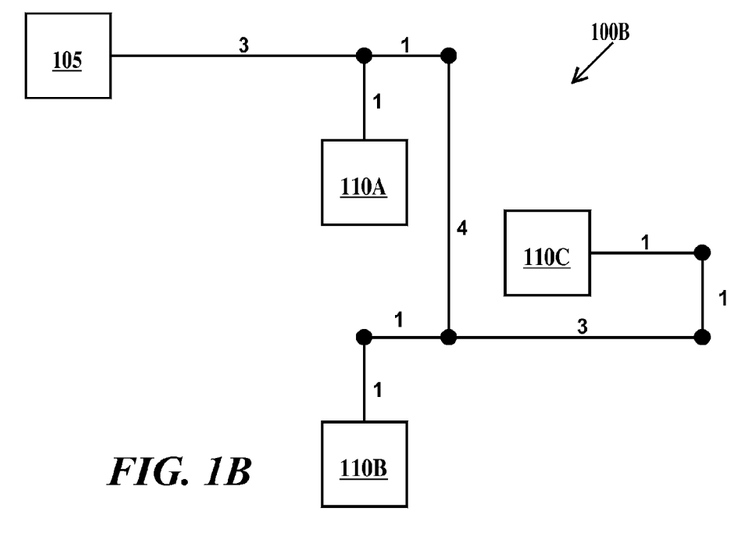
FIG. 1B is a physical representation of the net of FIG. 1A according to embodiments of the present invention.

FIG. 1B is a physical representation of the net of FIG. 1A according to embodiments of the present invention. In FIG. 1B, a physical net representation 100B includes an exemplary physical feature of wire length of the various paths between pattern input point 105 and pattern observation points 110A, 110B and 110C. Physical features may be quantitative features, geometric features or parametric features. Examples of quantitative features include, but are not limited to, the length and level of wires in the path, the number of vias in the path, particular types of circuit elements (defined supra). Geometric features include, but are not limited to, wires crossing over or under other wires in adjacent wiring levels, wires spaced apart certain distances, wires having a certain number of direction changes and wires spaced apart a specified distance from other wires not necessarily in the same path, total area of a net or circuit, and critical area of a net or circuit. Parametric features include, but are not limited to, transistor threshold voltages, operating voltage levels, clock domains and device design parameters (e.g., device width, threshold voltage, drive current, switching speed, etc.).

In the context of this invention, a physical feature (e.g. a wire or a via) is associated with a metric or a measurement unit (e.g. length or number vias). The metric is used to determine weights. For example, the amount of a selected feature present on each net or net segment can be used to determine weights for nets and net segments. The metric-based weights can be used to calculate physical feature-based test coverage, specifically, to evaluate how much of the selected feature is tested by a given test set. Weights are also used to weigh faults and calculate cost functions at observation points. An example of how metric-based weights can be used to calculate physical feature-based test coverage is described next.

Table I compares test coverage based on logical representation 100A of FIG. 1A and physical net representation 100B of FIG. 1B for a test pattern applied to the pattern input point 105 and read from the indicated pattern observation points. Logical test coverage is the number of paths tested divided by the total number of paths, where in this example, a path is said to be tested if all the stuck-at faults (both $F^0$ and $F^1$) on the path are tested. Physical test coverage is the wire length (the selected feature being wiring and the metric being wire length) in a particular tested path or set of paths divided by the total wire length of the circuit.

TABLE I

| Observation Point(s) | Logical Test Coverage | % Logical Test Coverage | Physical Test Coverage | % Physical Test Coverage |
|---|---|---|---|---|
| 110A | 1/3 | 33 | 4/16 | 25 |
| 110B | 1/3 | 33 | 10/16 | 63 |
| 110C | 1/3 | 33 | 13/16 | 82 |
| 110B & 110C | 2/3 | 67 | 15/16 | 94 |
| 110A & 110B | 2/3 | 67 | 11/16 | 69 |
| 110A & 110C | 2/3 | 67 | 14/16 | 88 |
| 110A & 110B & 110C | 3/3 | 100 | 16/16 | 100 |

It can be seen from Table I that in seven of the eight possible paths, test coverage in the physical model is different from the logical model with respect to the feature "wire length." Under the restraint of choosing only one pattern observation point and looking at only logical test coverage, a user would conclude that applying test patterns observable at any one of pattern observation points 110A, 110B or 110C would give the same test coverage for any feature, but in reality, applying a test pattern observable at pattern observation point 110C gives the highest test coverage for the feature/metric wire/length.

It should be noted that the present invention is not limited to a physical circuit representation based on one feature, but is adaptable to multiple features at the same time. Calculations may be made in several ways: separate results for one feature/attribute at a time, for groups of features/attributes, or for all features/attributes. For example, if the dots in FIG. 1B are vias, then via test coverage for the path 105 to 110A is 1/6, for the path 105 to 110B is 4/6 and for the path 105 to 110C is 5/6. Via test coverage may therefore be combined with wire length test coverage using a simple addition, each wiring level change comparable to a unit of wiring length, to obtain, for example, a test coverage of (13+5)/22 for the path from pattern input point 105 to pattern observation point 110C. Other, more complex functions may also be used. For example, the result for each feature or attribute may be scaled due to relative critical areas or may be a more complex relationship for layout based dependencies, such as frequency of feature variations or inter-level dielectric (ILD) type and ILD thickness.

Weights may be adjusted to increase the importance of one feature over another. For example, metal lines may be weighed by units of length and vias by the frequency of occurrence in a net. In a net, where vias are known to be a potential defect source, the weights of the vias may be increased by multiplying by a coefficient. In another example, the weights of metal lines and vias may be scaled to give equal weight to both. Therefore, coefficients may be applied to each feature type or to each individual feature in a net (e.g. some M1 wires in a net could have a different coefficient than other M1 wires in the same net). The result for each feature or attribute may be multiplied by a coefficient to scale its relative contribution to test coverage. Returning to the previous example, combining via test coverage with wire length test coverage, the resulting test coverage may be equal to $[a1*(^{13}/_{16})+a2*(^{5}/_{6})]/(a1+a2)$, where a1 and a2 are functions of design-based critical area, relative defect probability, and a2 is a function of a1.

Figure 2:
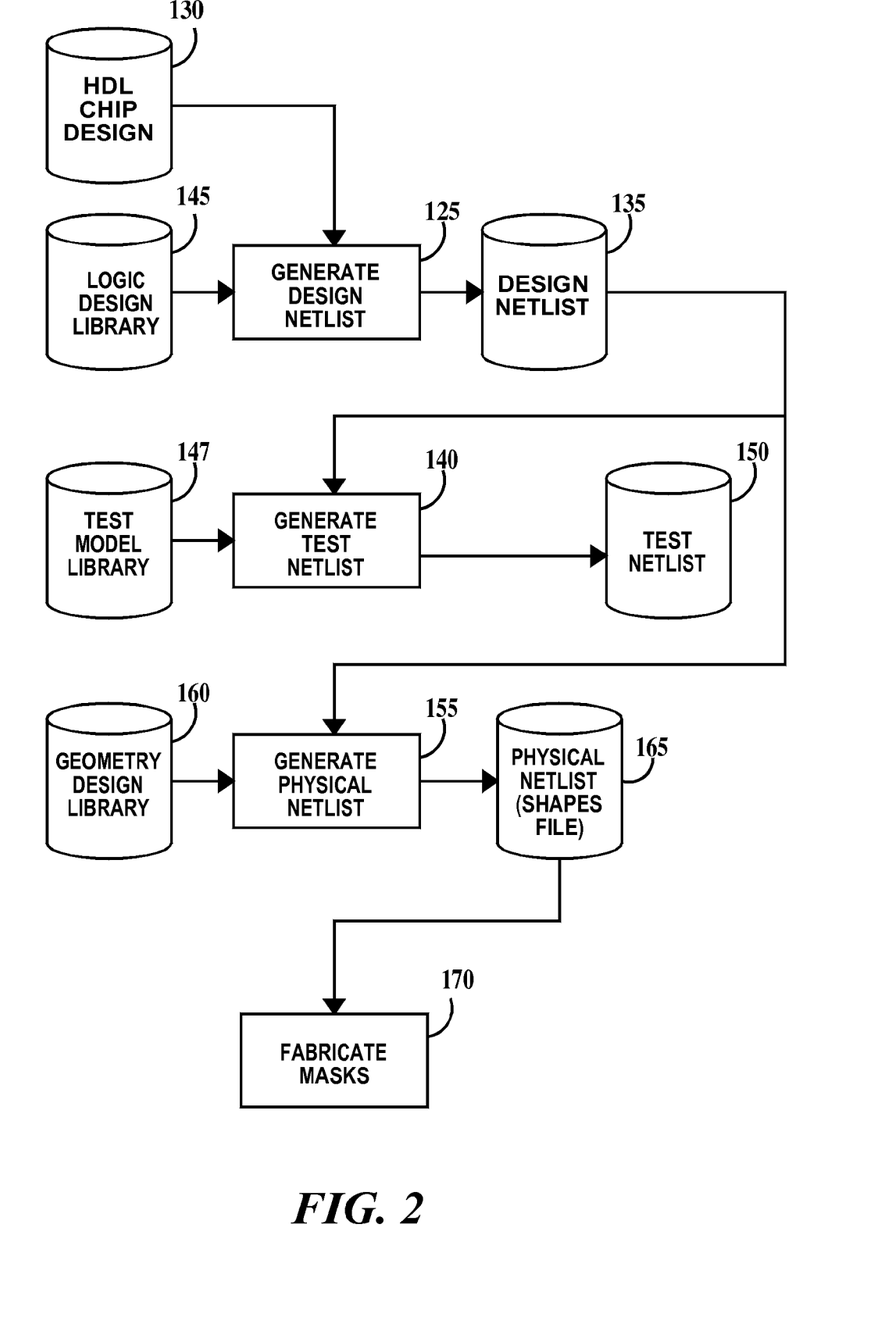
FIG. 2 is a flow diagram illustrating an exemplarily method of generating integrated circuit designs.

FIG. 2 is a flow diagram illustrating an exemplarily method of generating integrated circuit designs. In step 125, a design netlist 135 is generated from a design description 130 (e.g., hardware description language (HDL)) and a logic design library 145. A netlist describes how individual components of an integrated circuit chip are connected to each other. Next, in step 140, a test netlist 150 is generated using information from a test model library 147 and design netlist 135. Test netlist 150 includes a listing of circuits and faults to test those circuits as well as circuit and net connection information. Test netlist 150 is later used to generate test patterns by running a test pattern generation program against the test netlist. Next, in step 155, a physical netlist (e.g. a shapes file) 165 is generated from design netlist 135 and a geometry design library 160. Next, in step 170, masks are fabricated using physical netlist 165. Additional steps, such as simulation, timing analysis, design verification, and mask data prep are not shown in FIG. 2.

Figure 3:
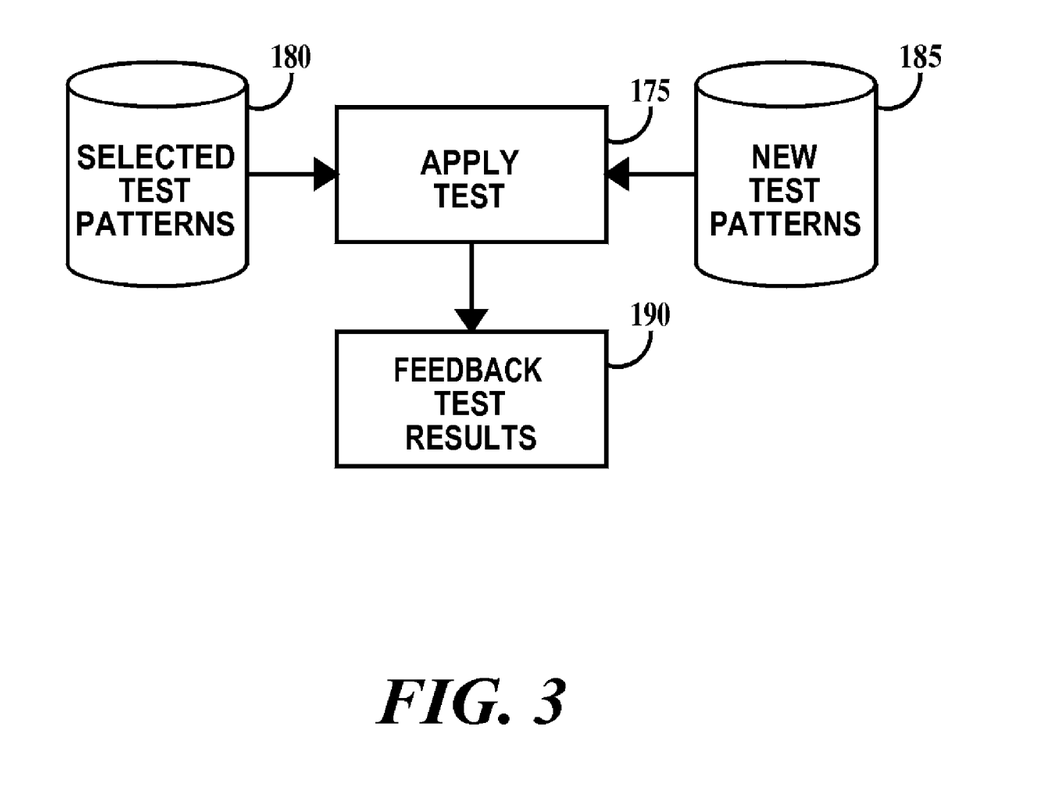
FIG. 3 is an overall flowchart illustrating testing integrated circuits according to embodiments of the present invention.

FIG. 3 is an overall flowchart illustrating testing integrated circuits according to embodiments of the present invention. In step 175, a test is performed using either selected test patterns 180 or new test patterns 185. Selected test patterns 180 are a subset of the previously existing test patterns. These patterns may be conventional test patterns generated by running a test pattern generation program against test netlist 150 (see FIG. 2). New test patterns are created using the weighted test, as described infra. In step 190, after testing, the results may be fed back to any point in the design, test, and manufacturing flow, but in particular to chip design and/or chip fabrication (including mask fabrication) for adjustment of the design and/or fabrication process to eliminate or reduce the frequency of the fails detected by the testing.

Figure 4:
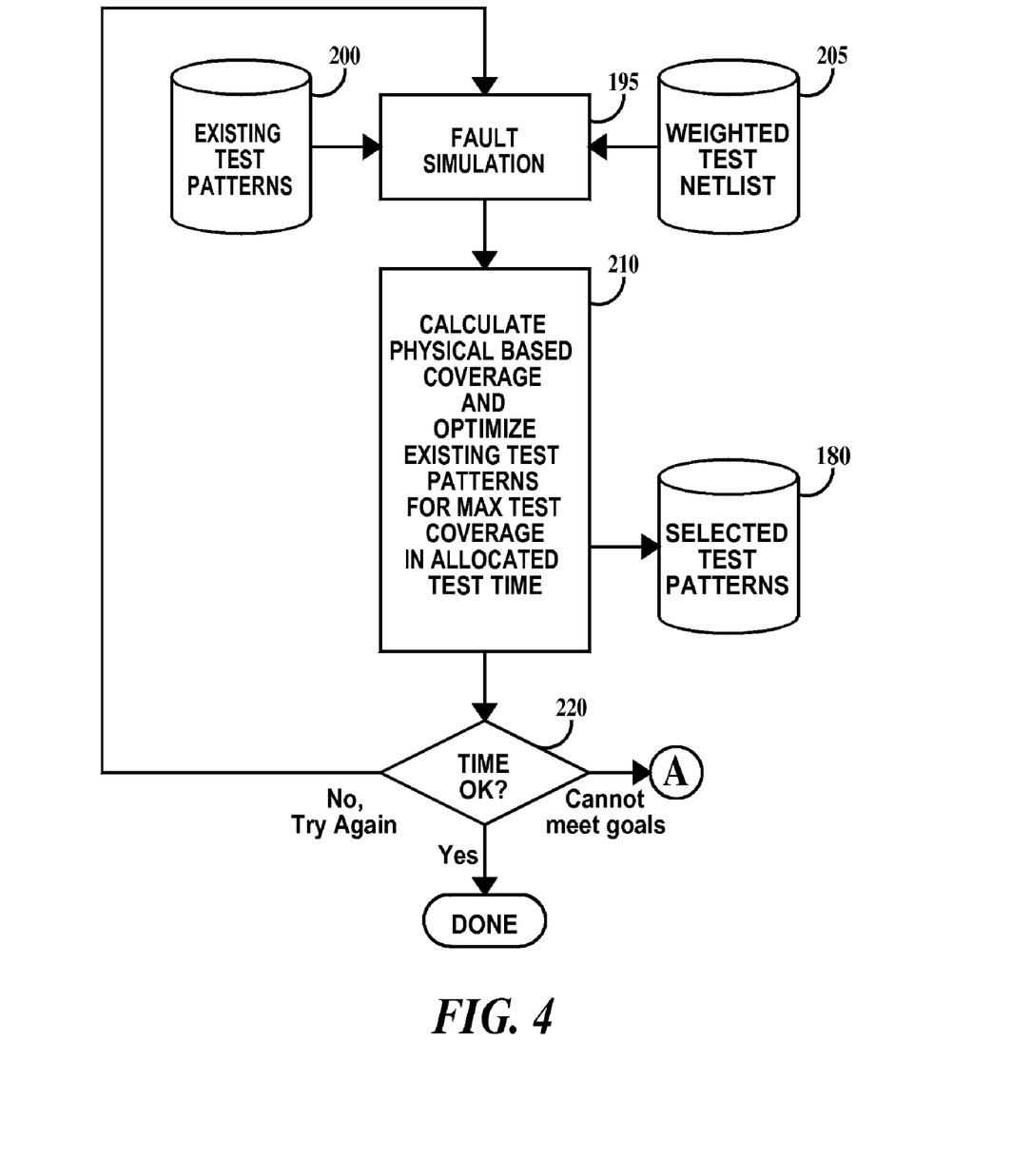
FIG. 4 is a flowchart illustrating a method of selecting test patterns from pre-existing test patterns according to embodiments of the present invention.
Figure 7:
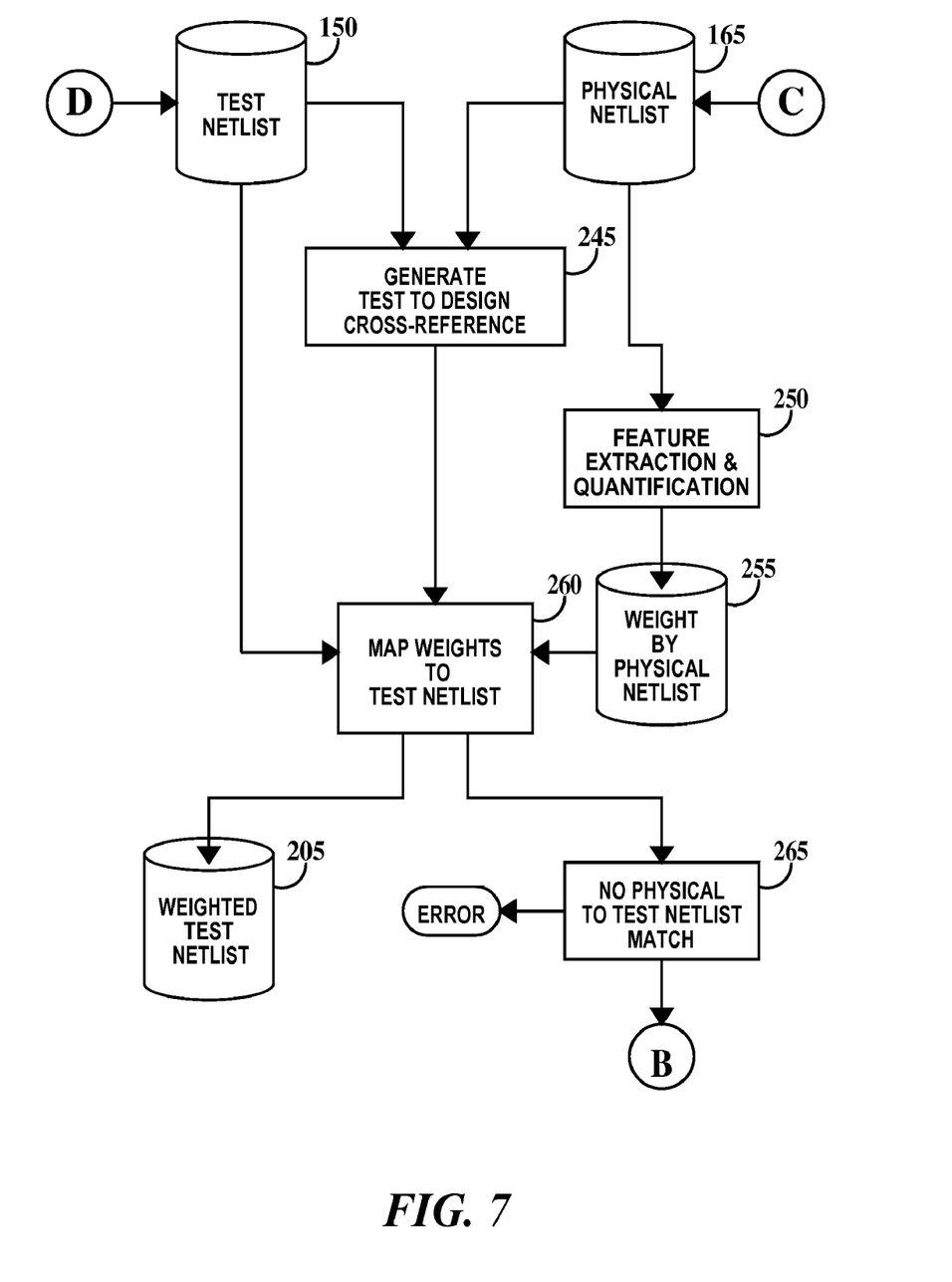
FIG. 7 is a flowchart for generating a weighted test netlist according to embodiments of the present invention.

FIG. 4 is a flowchart illustrating a method of selecting test patterns from pre-existing test patterns according to embodiments of the present invention. In step 195, fault simulation is performed using existing test patterns 200 that may have been generated using test netlist 150 (see FIG. 2) against a weighted test netlist 205. Generation of weighted test netlist 205 is illustrated in FIG. 7 and described infra. Weighted test netlist 205 serves as the simulation model and the existing test patterns 200 are the input to the model. Next, in step 210, the physical test coverage is calculated in a manner similar to that described supra and illustrated in Table I and the existing test patterns are optimized for maximum physical test coverage to generate selected test patterns 180. Maximum physical test coverage may be constrained by a test time target (the amount of tester time needed to apply the test on a particular tester) or other constraints, such as the amount of time needed to optimize the patterns or the pattern data volume. With a test time target, the time required to run the test patterns is tracked either directly or indirectly by the number of patterns. Examples of methods for optimizing the test patterns include, but are not limited to, ranking the test patterns or compacting the test patterns. Ranking test patterns includes, but is not limited to, changing the order the test patterns are applied by, for example, either trial and error or by algorithm. Examples of algorithms include reversing and reordering the test patterns. Compacting test patterns is the process of combining two or more test patterns into a single test pattern using an algorithm. Compaction may combine higher coverage portions of patterns into new patterns. Next, in step 220, it is determined if the test time target or other constraints using selected test patterns 180 are satisfied. If the test time is equal to or less than the target test time, this portion of the present invention is complete. If the test time is greater (within limits) than the allotted test time, the method loops back to step 195. Different ranking/compaction criteria are applied each time through step 195. Optionally, if the test time is less (within limits) than the target test time, it is possible to loop back to step 195 in order to increase the physical test coverage for the allotted amount of time (not shown in FIG. 4).

Figure 5:
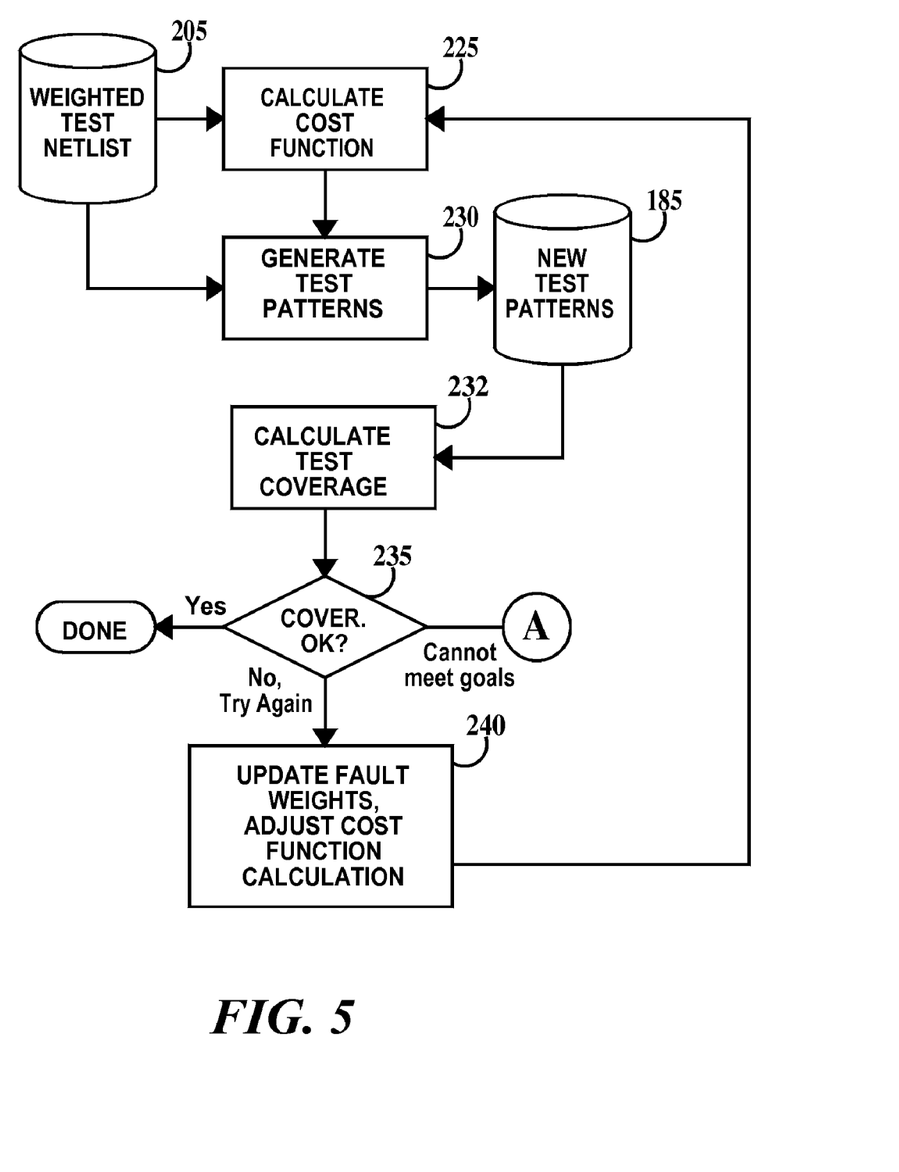
FIG. 5 is a flowchart illustrating a method of generating test patterns specific to the method of the embodiments of the present invention.

FIG. 5 is a flowchart illustrating a method of generating test patterns specific to the method of the embodiments of the present invention. In step 225, a cost function is generated from weighted test netlist 205 and in step 230 new test patterns 185 are generated based on weighted test netlist 205, and the cost function generated in step 225. The cost function for a given pattern observation point is the sum of the metrics of the selected feature or attribute or features and attributes on all nets or net segments observable at that pattern observation point. There will be a cost function for each pattern observation point to each pertinent pattern input point served by the pattern observation point. Next in step 232, physical coverage is calculated from weighted test netlist 205 and new test patterns 185. Next in step 235, it is decided if the test coverage meets a preset goal. If the test coverage meets goals then this portion of the present invention is complete, if not then either the methods proceeds to step 240 to try again or to FIG. 8 via connector A or if the test coverage goals have not been met after a pre-set number of loops through step 240. In step 240, the fault weights are updated and the cost function adjusted and the method loops back to step 225. A fuller description of steps 235 and 240 is given infra.

Though nets are usually defined in terms of logic gates as the net elements, entire circuits made up of many gates may be considered as nets, with the input(s) and output(s) of the entire circuit defining the fan out paths. Nets may be nested within nets. An embodiment of the present invention using nets is described using FIG. 6 and Table II.

Figure 6:
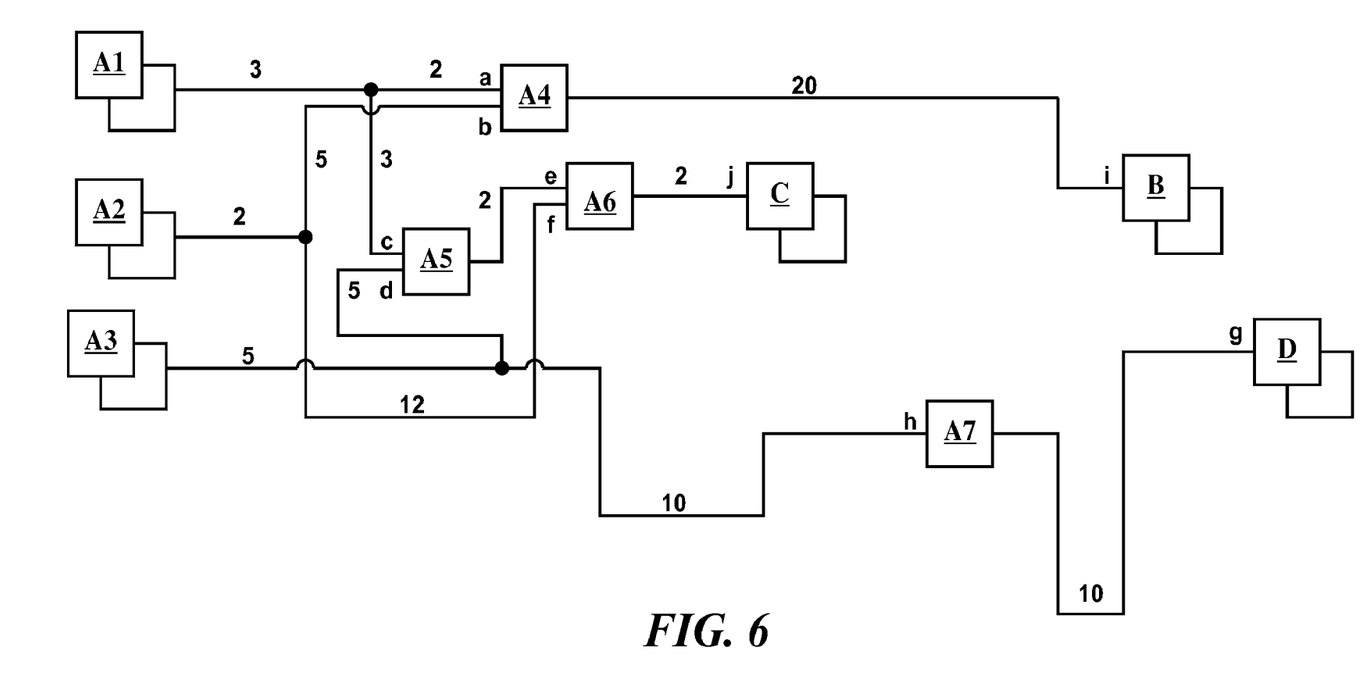
FIG. 6 is a physical representation of an exemplarily circuit illustrating the methodology of the embodiments of the present invention.

FIG. 6 is a physical representation of an exemplarily circuit illustrating the methodology of the embodiments of the present invention. In FIG. 6, all signals propagate from left to right. In FIG. 6, there are seven nets. The first net is from pattern input point A1 to intermediate points A4 and A5. The second net is from pattern input point A2 to intermediate points A4 and A6. The third net is from pattern input point A3 to intermediate points A5 and A7. The fourth net is from intermediate point A4 to pattern observation point B. The fifth net is from intermediate point A5 to intermediate point A6. The sixth net is from intermediate point A6 to pattern observation point C. The seventh net is from intermediate point A7 to pattern observation point D. Typically, multiple faults may be associated with a particular net, pin, or circuit. For example, a pin may have a stuck-at zero and a stuck-at one fault on it. In this example, only single faults are shown for clarity. Faults a and b are associated with the input pins of intermediate point A4, first and second nets, respectively. Faults c and d are associated with the input pins of intermediate point A5, first and third nets, respectively. Faults e and f are associated with the input pins of intermediate point A6, fifth and second nets, respectively. Faults g, h, i, and j are associated with the inputs of D, intermediate point A7, B, and C, the seventh, third, fourth and sixth nets, respectively.

A net segment is defined as a portion of a net. Segments may be defined in terms of a logic representation or netlist, such as the design or test netlists. They may also be defined in terms of their physical implementation, such as a placed and routed netlist, physical netlist or shapes file. In FIG. 6, net segments are defined by net inputs (sources), outputs (sinks), and branch points, which are indicated by dots. A net includes one or more connected segments. In FIG. 6, the first net includes three segments having respective weights 3, 3 and 2. The second net includes three segments having respective weights 2, 5 and 12. The third net includes three segments having respective weights 5, 5 and 10. All other nets are single segment nets.

For each fault in FIG. 6, Table II lists the initial weight assigned to the fault, other faults on the same net, and the cost functions for paths between pattern input points and pattern observation points B, C and D that would be calculated the first time through step 230 of FIG. 5. The initial cost functions appear at the bottom of Table II. In this example, stuck-at faults are used as an example to describe the overall procedure, although faults of any other type can also be used. In the weighted test netlist (further described infra), each fault is assigned a derived weight, the weight being derived from weights on nets and net segments associated with the fault. Fault weights are used to calculate the cost functions. In this example, fault weights are summed for each path between pattern input point and pattern observation point. The invention supports use of more complex cost functions.

TABLE II

| Fault | Weight | Faults on Same Net |
|---|---|---|
| a | 5 | c |
| b | 7 | f |
| c | 6 | a |
| d | 10 | h |
| e | 2 | |
| f | 14 | b |
| g | 10 | |
| h | 15 | d |
| i | 20 | |
| j | 2 | |
| Total | 81 | |

| | Cost Functions |
|---|---|
| B | a + i = 25, b + i = 27 |
| C | c + e + j = 10, d + e + j = 14, f + j = 16 |
| D | h + g = 25 |

Test generation is directed to faults that contribute high cost function values. In step 225, test patterns are generated that target specified faults according to an algorithm that tends to choose groups of faults with the highest cost function without repeating faults. As an embodiment, for each pattern observation point, the algorithm finds the combination of faults that give the highest physical test coverage obtainable with a single test pattern. Using the example of Table II and FIG. 6, an exemplary algorithm has the following steps:

(1) Determine the group or group(s) of compatible faults that have the highest combined cost function. In Table II, ordering pattern observation points B, C and D in the sequence of highest cost functions results in the order B, D and C. Identify faults b and i (b+i=27) for observation point B and faults h and g (h+g=25) for observation point D as the combination of independent logic that results in the highest total cost function. Referring to FIG. 6, testing for faults b and i requires a test pattern to have a defined logical value (0 or 1) on pattern input point A2, while testing for faults h and g require a test pattern with a defined logical value on pattern input point A3. Pattern input point A1 may require a defined logical value, depending on the logical function of A4.

(2) Generate a pattern targeting faults having the highest combined cost function for each observation point. The combined cost function for the newly generated pattern may include contributions for observation points with lower cost functions. In the example, an additional cost function contribution may come from pattern observation point C, depending on the logical values required to activate faults b, i, h, and g. For instance, if A1, A2, and A3 logic states activate faults c, e, and j, then the cost function for C is added to the total cost function. In some situations, a group of faults with lower cost functions may sum to more than the highest single cost function result.

(3) Change the weights of all faults based on the cost functions selected in (1) and (2). After performing the above algorithm for the example, Table III results in updated fault weights and cost function values.

(4) Compare the calculated test coverage or coverage's with the target test coverage criterion. Test coverage can be calculated in terms of physical nets and net segments using weights associated with physical features and attributes, in terms of faults using the initial (original) derived fault weights, or incrementally, in terms of faults using the updated derived fault weights. A key facet of this invention is the capability to map physical features or attributes to faults.

TABLE III

| Fault | Weight | Faults on Same Net |
|---|---|---|
| a | 2 | c |
| b | 0 | f |
| c | 0 | a |
| d | 5 | h |
| e | 0 | |
| f | 12 | b |
| g | 0 | |
| h | 0 | d |
| i | 0 | |
| j | 0 | |
| Total | 19 | |

| Cost Functions | |
|---|---|
| B | a = 2 |
| C | d = 5, f = 12 |
| D | 0 |

Step (3) is continued in Table III. The test coverage is (81−19)/81=62/81. Note that the weight of fault a changed from 5 to 2, because a 3-unit segment of the net leading to fault a was used in the path from pattern input point A1 to pattern observation point C. The weight of fault d went from 10 to 5 because a 5-unit segment of the net leading to fault d was used in the path from pattern input point A3 to pattern observation point D. The weight of fault f went from 14 to 12, because a 2-unit segment of the net leading to fault f was used in the path from pattern input point A2 to pattern observation point B. All other fault weights went to zero, because the entire lengths of segments associated with those faults were covered by the test pattern in the paths from pattern input points to pattern observation points.

Repeating steps (1), (2), (3) and (4) of the algorithm supra results in choosing C fault f=12 and B fault a=2 with the test coverage being (81−5)/81=76/81 as shown in Table IV.

TABLE IV

| Fault | Weight | Faults on Same Net |
|---|---|---|
| a | 0 | c |
| b | 0 | f |
| c | 0 | a |
| d | 5 | h |
| e | 0 | |
| f | 0 | b |
| g | 0 | |
| h | 0 | d |
| i | 0 | |
| j | 0 | |
| Total | 5 | |

| Cost Functions | |
|---|---|
| C | d = 5 |

Weight updates in step (3) and test coverage calculates in step (4) may be done for every pattern or after groups of patterns have been generated. This allows efficient and effective implementation of the invention. Patterns may be treated as existing patterns and be ordered and truncated for test, if test coverage or test time targets change.

Returning to FIG. 5, in step 235, it is first determined if the test coverage using the new test patterns is sufficient (equal to or greater within limits) than a target test coverage value and if a target test time has not been exceeded (within limits). At this point, there are several options. First, if a test time target has not been exceeded the method proceeds to step 240 in order to increase the test coverage. In a second option, if the test coverage is less than a target test coverage the method proceeds to step 240 in order to increase the test coverage even if the test time increases. In a third option, if the test coverage is equal to or greater than the target test coverage, this portion of the present invention is complete. In a fourth option, if the test time is equal to or less than the target test time, this portion of the present invention is complete. In a fifth option, if both the test coverage (within limits) is equal to or greater than the target test coverage and if the test time (within limits) is equal to or less than the target test time this portion of the present invention is complete. A sixth option is to go to FIG. 8 via connector A if, after a predetermined (e.g. preset) number of loops through steps 225, 230, 232, 235 and 240, satisfactory test coverage and/or test time is not achieved.

In step 240, the derived fault weights are updated (as previously described). Additionally, the physical feature(s) or attributes associated with the features being represented by weights may be changed, or the cost function or test coverage calculations may be adjusted. Calculation adjustments may be made due to a change in feature(s) or attribute(s) or due to fine tuning the calculations for optimum test generation. In one embodiment, weights and patterns may be generated for all feature(s)/attributes(s) at once or serially in groups or singly.

FIG. 7 is a flowchart for generating a weighted test netlist according to embodiments of the present invention. In step 245, a cross-reference of test netlist 150 to physical netlist 165 is generated. Test netlist 150 includes a listing of all nets and associated faults. In step 250, feature extraction and quantification is performed on physical netlist 165 to generate a weight by physical netlist component file 255. For example, during step 250 the feature M1 wire, using the metric length, is extracted for each net. Next, in step 260, the weights from file 255 are mapped to test netlist 150 using the cross-reference generated in step 245 to generate weighted test netlist 205. For example, during step 260 the value of the metric length becomes the weight mapped into to test netlist 150 to create weighted test netlist 205. Weighted test netlist 150 includes a listing of all nets, net segments, and associated faults by feature ID (e.g. M1 wire) and weight (e.g. number of units of length).

An important distinction between a test netlist and a weighted test netlist is a weighted test netlist includes weights assigned to each segment of the nets of an integrated circuit while a test netlist does not include any information relating to weights associated with physical feature(s) or attribute(s) of the integrated circuit. Practically, not all physical nets may be included in the weighted test netlist, due to modeling and naming mismatches.

Figure 8:
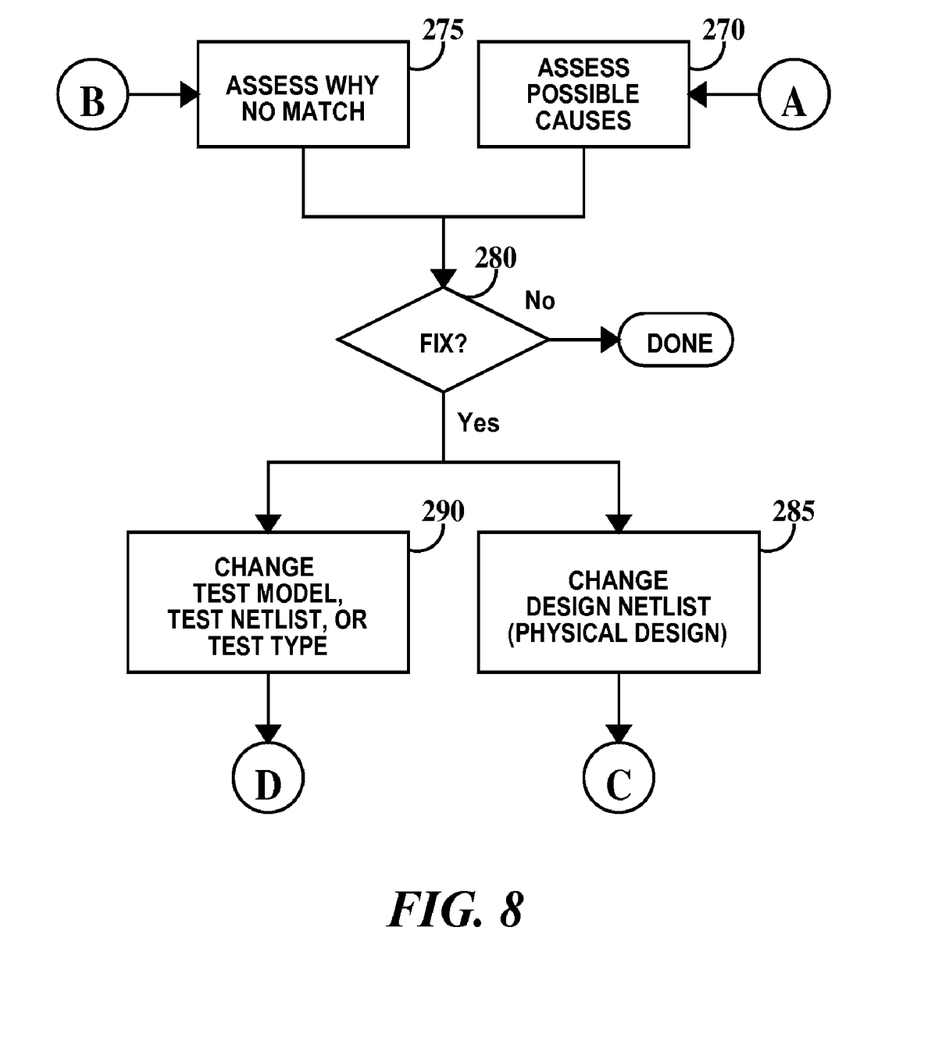
FIG. 8 is a flowchart illustrating a method of increasing test coverage of the embodiments of the present invention.

In the event that there is no physical to test netlist match, an error is generated in step 265 and the method proceeds to FIG. 8 via connector B. Connectors C and D allow feedback of corrections made in FIG. 8.

FIG. 8 is a flowchart illustrating a method for increasing test coverage of the embodiments of the present invention. In step 270, a user, a debug program, or a combination of both assess why the test coverage or test time targets cannot be made. In step 275, a user, a debug program, or a combination of both, assess why there is no match between the test netlist and the physical netlist. In step 280, a user decides if there is a fix and if the fix should be implemented. If there is no fix or the user decides not to implement the fix then the method is complete and a decision to proceed with testing according to the embodiments of the present invent is made. If there is a fix and the user decides to make the fix, then the method proceeds to step 285 if entry was made from connector A or to step 290 if entry was made from connector B. In step 285, a correction or change to the design netlist is made and the method loops back to FIG. 7 via connector C, and steps 245, 250, and 260 are repeated. In step 290, a correction or change to the test netlist is made and the method loops back to FIG. 7 via connector D, and steps 245, 250, and 260 are repeated. In step 290, changes and/or corrections can also be made to the test model or test type (e.g. fault type). These changes may require generation of new test patterns or rerunning of simulations to determine test time and coverage, as such, must be determined for each change individually. These change require re-entry to flowcharts of FIGS. 2, 3, 4 5 and 7 at appropriate steps. These re-entry points to the flowcharts of FIGS. 2, 3, 4, 5 and 7 are not illustrated because of the large number of possible re-entry points.

Figure 9:
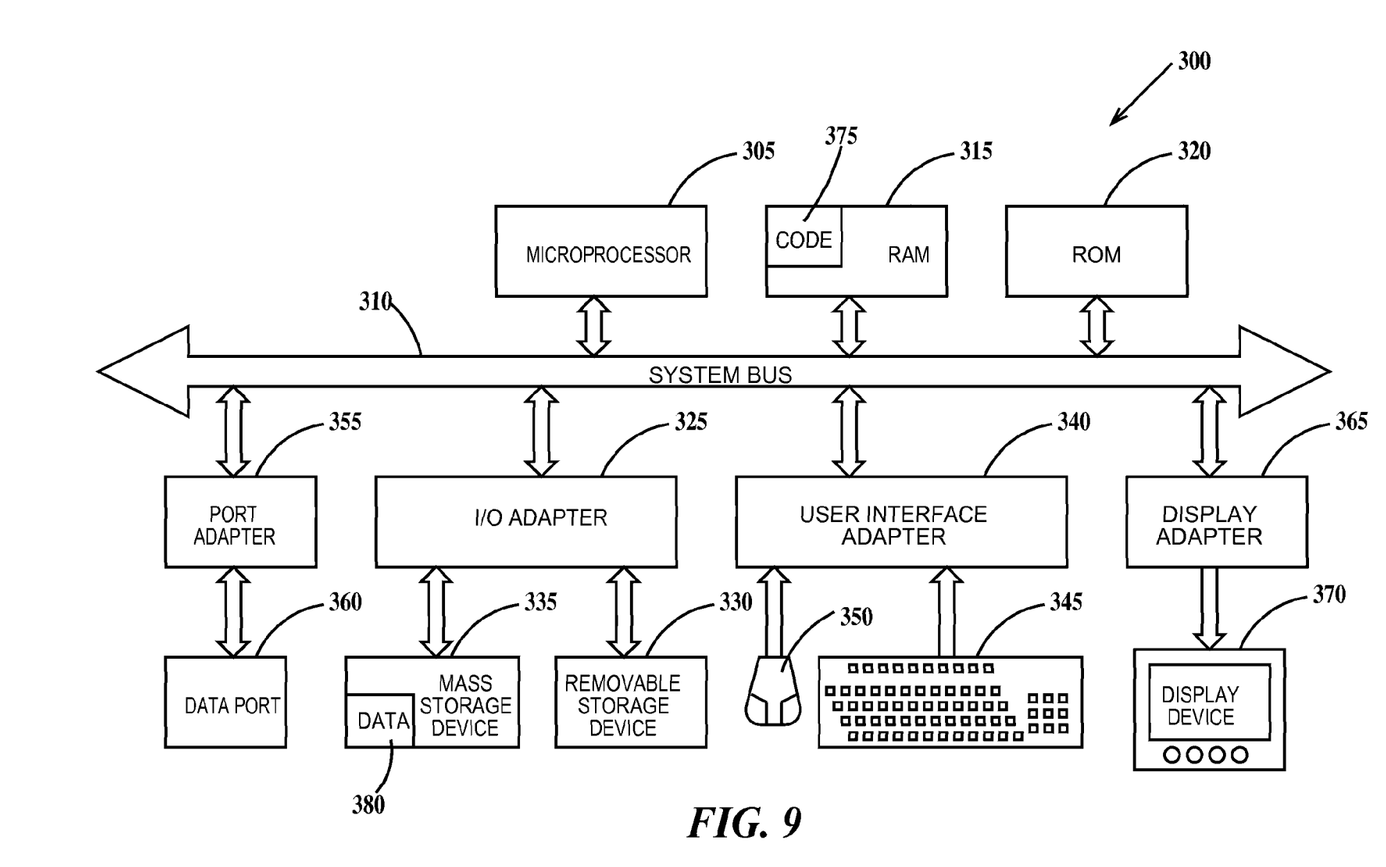
FIG. 9 is a schematic block diagram of a general-purpose computer for practicing the embodiments of the present invention.

FIG. 9 is a schematic block diagram of a general-purpose computer for practicing the embodiments of the present invention. In FIG. 9, computer system 300 has at least one microprocessor or central processing unit (CPU) 305. CPU 305 is interconnected via a system bus 310 to a dynamic random access memory (DRAM) device 315 and a read-only memory (ROM) device 320, an input/output (I/O) adapter 325 for a connecting a removable data and/or program storage device 330 and a mass data and/or program storage device 335, a user interface adapter 340 for connecting a keyboard 345 and a mouse 350, a port adapter 355 for connecting a data port 360 and a display adapter 365 for connecting a display device 370.

Either of devices 315 and 320 contains the basic operating system for computer system 300. Removable data and/or program storage device 330 may be a magnetic media such as a floppy drive, a tape drive or a removable hard disk drive or optical media such as CD ROM or an eraseable/writeable CD or a digital video disc (DVD) or solid state memory such as ROM or DRAM or flash memory. Mass data and/or program storage device 335 may be a hard disk drive or an optical drive or a networked data storage system. In addition to keyboard 345 and mouse 350, other user input devices such as trackballs, writing tablets, pressure pads, microphones, light pens and position-sensing screen displays may be connected to user interface 340. Examples of display devices include cathode-ray tubes (CRT) and liquid crystal displays (LCD).

One of devices 315, 320, 330 or 335 includes a computer code 375 (illustrated by way of example in device 315), which is a computer program that comprises computer-executable instructions. Computer code 375 includes an algorithm for selecting or generating test patterns based on physical features of the circuit being tested (e.g. the algorithm of FIGS. 2, 3, 4, 5, 7 and 8). CPU 305 executes computer code 375. Any of devices 315, 320, 330 or 335 may include input data 380 (illustrated by way of example in device 335) required by computer code 375. Display device 370 displays output from computer code 375.

Any or all of devices 315, 320, 330 and 335 (or one or more additional memory devices not shown in FIG. 9) may be used as a computer usable medium (or a computer readable medium or a program storage device) having a computer readable program embodied therein and/or having other data stored therein, wherein the computer readable program comprises computer code 375.

Thus the present invention discloses a process for supporting computer infrastructure, integrating, hosting, maintaining, and deploying computer-readable code into the computer system 300, wherein the code in combination with the computer system 300 is capable of performing a method for generating test patterns and evaluating the test patterns based on how well the test patterns test the physical features and attributes associated with the features of an integrated circuit as well as a method for evaluating existing test patterns and generate test patterns to test selected physical layout features.

Thus the present invention provides a method of generating test patterns and evaluating the test patterns based on how well the test patterns test the physical features and attributes associated with the features of an integrated circuit as well as a method for evaluating existing test patterns and generate test patterns to test selected physical layout features.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
  a processor of a computer determining one or more paths of a circuit to be tested, each path of said one or more paths independently comprising one or more nets;
  selecting a set of quantitative, geometric or parametric features of said nets, said circuit having one or more pattern input points and one or more pattern observation points connected by said nets, each of said nets defined by an input point and all fan out paths to (i) input points of other nets of said nets or (ii) to said pattern observation points, each net of said nets comprising one or more connected segments;
  selecting a unit of measure for each feature of said set of features;

assigning a weight to each said segment of said nets based on a number of said unit of measure of said feature in each segment of each fan out path of each of said nets; and said processor generating a set of test patterns based on said weights assigned to each segment of each fan out path of each of said nets of said circuit.

2. The method of claim 1, further including:

applying said set of test patterns to said pattern input points and observing a resultant test pattern at said pattern observation points.

3. The method of claim 1, wherein said generating said set of test patterns includes selecting a subset of initial test patterns generated from a test netlist, said test netlist describing said nets of said integrated circuit and faults for testing said nets, said test netlist not including information relating to said weights assigned to each segment of said nets of said integrated circuit.

4. The method of claim 3, wherein said selecting said subset of said initial test patterns is based on said weights assigned to each segment of each fan out path of each of said nets of said circuit.

5. The method of claim 4, further including:

(a) calculating a physical test coverage, said physical test coverage defined as a ratio of a weighted sum of weights of segments associated with faults testable by said set of test patterns to a sum of all weights of all segments of said nets;

(b) changing said set of test patterns based on said physical test coverage ratio if said physical test coverage ratio is less than a target value; and (c) repeating steps (a) and (b) until said ratio is equal to or greater than said target value or until a steps (a) and (b) have been repeated a predetermined number of times.

6. The method of claim 1, wherein said generating said set of test patterns includes creating test patterns from a weighted test netlist, said weighted test netlist including weights assigned to each segment of each of said nets of said circuit.

7. The method of claim 6, wherein said creating said test patterns includes:

(a) calculating one or more cost functions for each pattern observation point, each cost function consisting of a different combination of faults and each cost function including only and all faults between one pattern observation point and one pattern input point.

8. The method of claim 7, wherein a numerical value of a particular cost function is based on said weights associated to each fault included in said particular cost function.

9. The method of claim 8, further including:

(b) calculating a physical test coverage, said physical test coverage defined as a ratio of a sum of weights associated with all segments associated with faults testable by said set of test patterns to a sum of all weights of all segments of said nets;

(c) changing said set of test patterns based on said physical test coverage ratio if said physical test coverage ratio is less than a target value; and (d) repeating steps (b) and (c) until said ratio is equal to or greater than said target value or until a steps (b) and (c) have been repeated a predetermined number of times.

10. The method of claim 1, wherein said features are selected from the group consisting of wire length, number of vias, number of particular circuit element type, number of occurrences of a wire crossing another wire, number of wires spaced apart a certain distance, number of wires having a certain number of direction changes, number of wires spaced apart a specified distance from other wires, total area of a net, critical area of a net, device design parameter, transistor threshold voltage, operating voltage level and clock domain.

* * * * *